United States Patent
Lee et al.

(10) Patent No.: US 9,666,616 B2
(45) Date of Patent: May 30, 2017

(54) IMAGE SENSOR, IMAGE PROCESSING SYSTEM INCLUDING THE SAME, AND PORTABLE ELECTRONIC DEVICE INCLUDING THE SAME

(71) Applicant: Samsung Electronics Co., Ltd., Suwon-si (KR)

(72) Inventors: Jun Suk Lee, Seoul (KR); Jung Chak Ahn, Yongin-si (KR); Hee Geun Jeong, Suwon-si (KR); Kyung Ho Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/754,890

(22) Filed: Jun. 30, 2015

(65) Prior Publication Data

US 2016/0006965 A1   Jan. 7, 2016

(30) Foreign Application Priority Data

Jul. 7, 2014 (KR) .......................... 10-2014-0084690

(51) Int. Cl.
*H01L 27/146* (2006.01)
*H04N 5/357* (2011.01)
*H04N 5/361* (2011.01)

(52) U.S. Cl.
CPC .... *H01L 27/14605* (2013.01); *H01L 27/1463* (2013.01); *H01L 27/1464* (2013.01); *H01L 27/14612* (2013.01); *H01L 27/14621* (2013.01); *H01L 27/14636* (2013.01); *H04N 5/3575* (2013.01); *H04N 5/361* (2013.01)

(58) Field of Classification Search
CPC .......... H01L 27/14605; H01L 27/1464; H01L 27/1463; H01L 27/14612; H01L 27/14636; H01L 27/14621; H04N 5/3575; H04N 5/361
See application file for complete search history.

(56) References Cited

U.S. PATENT DOCUMENTS

| | | | |
|---|---|---|---|
| 6,344,877 B1 | 2/2002 | Gowda et al. | |
| 7,385,636 B2 * | 6/2008 | Xu ........................ | H04N 5/3575 348/241 |
| 7,427,740 B2 | 9/2008 | Park et al. | |
| 7,755,679 B2 | 7/2010 | Rossi et al. | |
| 7,923,727 B2 | 4/2011 | Misawa | |
| 8,482,639 B2 | 7/2013 | Tai et al. | |
| 8,482,647 B2 | 7/2013 | Kim et al. | |
| 8,488,028 B2 | 7/2013 | Koike | |
| 8,492,865 B2 | 7/2013 | Venezia et al. | |
| 2008/0218608 A1 | 9/2008 | Rossi et al. | |
| 2011/0032391 A1 | 2/2011 | Cheung | |
| 2011/0073923 A1 | 3/2011 | Tatani et al. | |
| 2011/0102620 A1 | 5/2011 | Sakano et al. | |
| 2011/0216000 A1 * | 9/2011 | Raynor .................. | G06F 3/042 345/157 |
| 2012/0104534 A1 | 5/2012 | Lee et al. | |

(Continued)

FOREIGN PATENT DOCUMENTS

KR   1020120002786 A   1/2012

*Primary Examiner* — Timothy J Henn
(74) *Attorney, Agent, or Firm* — Myers Bigel, P.A.

(57) ABSTRACT

An image sensor includes a first pixel that is in an active pixel region, a second pixel that is in a dummy region adjacent the active pixel region, and a first deep trench isolation (DTI) formed between the first pixel and the second pixel.

17 Claims, 27 Drawing Sheets

(56) References Cited

U.S. PATENT DOCUMENTS

| | | | |
|---|---|---|---|
| 2013/0099341 A1* | 4/2013 | Shim | H01L 27/1463 |
| | | | 257/432 |
| 2013/0134542 A1 | 5/2013 | Lu et al. | |
| 2013/0265472 A1 | 10/2013 | Manabe et al. | |
| 2014/0078354 A1* | 3/2014 | Toyoguchi | H01L 27/14603 |
| | | | 348/246 |
| 2014/0291481 A1* | 10/2014 | Zhang | H04N 5/361 |
| | | | 250/208.1 |

* cited by examiner

IMAGE SENSOR, IMAGE PROCESSING SYSTEM INCLUDING THE SAME, AND PORTABLE ELECTRONIC DEVICE INCLUDING THE SAME

CROSS-REFERENCE TO RELATED APPLICATION

This application claims priority under 35 U.S.C. §119(a) from Korean Patent Application No. 10-2014-0084690, filed on Jul. 7, 2014, the disclosure of which is hereby incorporated by reference in its entirety.

BACKGROUND

Embodiments of the inventive concepts relate to an image sensor and, more particularly, to an image sensor that includes a dummy region that is between an active pixel region and a guard ring region, an image processing system including the same, and a portable electronic device including the same.

Image sensors are devices that convert an optical image into an electrical signal. Image sensors are used in digital cameras and other image processing devices. Both charge-coupled device (CCD) image sensors and complementary metal-oxide-semiconductor (CMOS) image sensors are known in the art.

An image sensor includes an active pixel region (or an active pixel array) in which a plurality of pixels are arranged in a matrix. Each of the pixels includes a photoelectric conversion element which generates an electrical signal that changes as a function of the amount of incident light. The image sensor processes the electrical signal generated by the photoelectric conversion element to generate image data.

Each pixel in the active pixel region includes a plurality of transistors. To reduce crosstalk between the pixels, a deep trench isolation (DTI) may be formed. Transistors and DTIs in pixels formed at the edges of the active pixel region, unlike those in pixels formed in the middle of the active pixel region, may have lower uniformity, which may lead to a deterioration in the quality of the images generated by the image sensor.

SUMMARY

Some embodiments of the inventive concepts provide image sensors that may exhibit improved performance by increasing the uniformity of transistors in the pixels that are formed in an active pixel region and by providing a deep trench isolation (DTI) between pixels. Image processing systems and a portable electronic device including such image sensors are also provided.

According to some embodiments of the inventive concepts, image sensors are provided that include a first pixel in an active pixel region, a second pixel in a dummy region that is adjacent the active pixel region, and a first DTI that is between the first pixel and the second pixel. The first pixel may include a photoelectric conversion element and the second pixel may not include a photoelectric conversion element.

The second pixel may include a plurality of transistors and a gate terminal of each of the transistors may be floated.

The image sensor may further include a guard ring in a guard ring region adjacent the dummy region, the guard ring electrically connected to a first voltage source and a second DTI that is between the dummy region and the guard ring region. The second pixel may include a plurality of transistors, a gate terminal of each of the transistors may be electrically connected to the guard ring, and the first voltage source may supply a ground voltage or a constant voltage.

According to further embodiments of the inventive concepts, there is provided an image processing system including an image sensor that is configured to generate image data and a processor that is configured to process the image data. The image sensor includes a first pixel in an active pixel region, a second pixel in a dummy region that is adjacent the active pixel region, a first DTI that is between the first pixel and the second pixel, a guard ring in a guard ring region that is adjacent the dummy region, the guard ring electrically connected to a first voltage source, and a second DTI that is between the dummy region and the guard ring region.

The first pixel may include a photoelectric conversion element and the second pixel may not include a photoelectric conversion element. The second pixel may not include a color filter. The second pixel may not include a microlens.

According to still further embodiments of the inventive concepts, an image sensor is provided that includes an active pixel region having a first pixel that is configured to output a first pixel signal using accumulated charges that are generated from light incident on the first pixel; a guard ring region that includes a first guard ring that is connected to a first voltage source and a second guard ring that is connected to a second voltage source; a dummy region having a second pixel, the dummy region between the active pixel region and the guard ring region; a first DTI between the active pixel region and the dummy region. In some embodiments, any pixel signal output by the second pixel is not based on an amount of light incident on the second pixel.

DETAILED DESCRIPTION OF THE EMBODIMENTS

Figure 1:
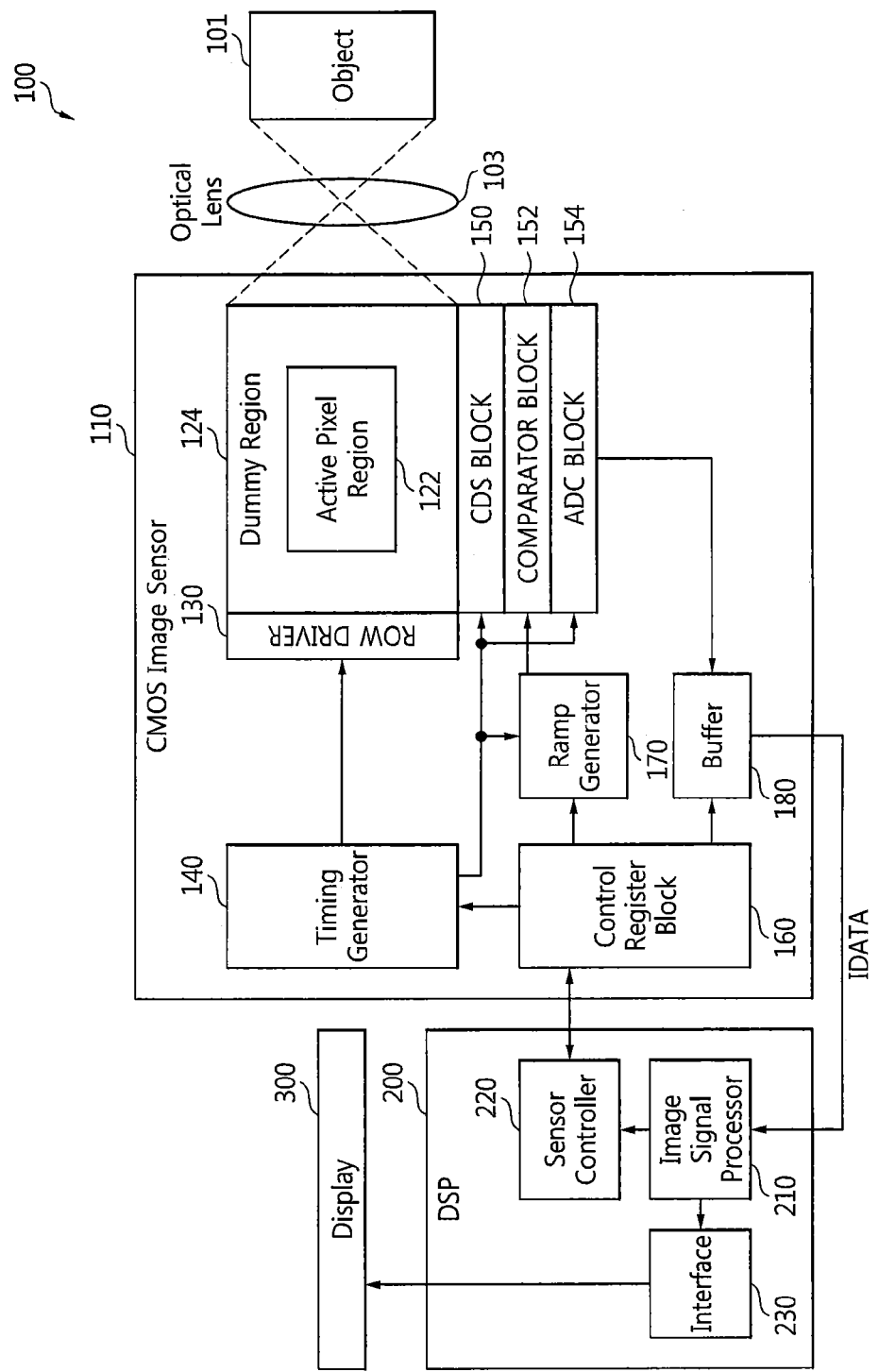
FIG. 1 is a block diagram of an image processing system according to some embodiments of the inventive concepts.

The inventive concepts now will be described more fully hereinafter with reference to the accompanying drawings, in which embodiments of the inventive concepts are shown. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first pixel could be termed a second pixel, and, similarly, a second pixel could be termed a first pixel without departing from the teachings of the disclosure.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, operations, elements, and/or components, but do not preclude the presence or addition of one or more other features, regions, operations, elements, components, and/or groups thereof.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of an image processing system 100 according to some embodiments of the inventive concepts. The image processing system 100 may be implemented as a portable electronic device. The portable electronic device may be, for example, a laptop computer, a cellular phone, a smart phone, a tablet personal computer (PC), a personal digital assistant (PDA), an enterprise digital assistant (EDA), a digital still camera, a digital video camera, a portable multimedia player (PMP), a mobile internet device (MID), a wearable computer, an Internet of things (IoT) device, or an Internet of everything (IoE) device. The image processing system 100 includes an optical lens 103, a complementary metal-oxide-semiconductor (CMOS) image sensor 110, a digital signal processor (DSP) 200, and a display 300. The elements 110 and 200 may be implemented in one or more integrated circuit chips.

The CMOS image sensor 110 may generate image data IDATA corresponding to an object input (or captured) through the optical lens 103. The CMOS image sensor 110 includes an active pixel region (or active pixel sensor (APS) region) 122, a dummy region 124, a row driver 130, a timing generator 140, a correlated double sampling (CDS) block 150, a comparator block 152, an analog-to-digital conversion (ADC) block 154, a control register block 160, a ramp generator 170, and a buffer 180.

The active pixel region 122 may include a plurality of first pixels. Each of the first pixels may accumulate charges that are generated from incident light and may generate a pixel signal corresponding to the accumulated charges. The first pixels may be arranged in a matrix.

Each of the first pixels is an active pixel. At least one of the first pixels may be an optical black pixel in other embodiments. Each of the first pixels may include a plurality of transistors and a photoelectric conversion element. The photoelectric conversion element may be a photodiode, a photo transistor, a photogate, or a pinned photodiode.

The dummy region 124 may be formed near the active pixel region 122. For example, the dummy region 124 may surround the active pixel region 122 in some embodiments, as shown in FIG. 1, but the inventive concepts are not restricted to such an arrangement. The dummy region 124 may be formed in the horizontal direction and/or vertical direction of the active pixel region 122 in other embodiments. The dummy region 124 may include a plurality of second pixels, which may be formed in a matrix.

The second pixels may have the same transistor structures as the first pixels or, alternatively, may have a different transistor structure. For instance, when the first pixels have a 4-transistor structure, the second pixels may have the 4-transistor structure. Alternatively, the transistor structure of the second pixels may be, for example, a three-transistor structure or a five-transistor structure. Various transistor structures for the second pixels will be described in detail with reference to FIGS. 5 through 24.

The row driver 130 may transmit a plurality of control signals to the active pixel region 122 that control the operation of the first pixels. The row driver 130 may be under the control of the timing generator 140. The row driver 130 may transmit the control signals to the dummy region 124 in some embodiments. The row driver 130 may control the operation of the pixels row by row.

The timing generator 140 may control the operations of the row driver 130, the CDS block 150, the ADC block 154, and the ramp generator 170. The timing generator 140 may be controlled by the control register block 160.

The CDS block 150 performs CDS on the pixel signals output from each of column lines formed in the active pixel region 122. The comparator block 152 compares pixel signals that have been subjected to CDS in the CDS block 150 with a ramp signal that is output from the ramp generator 170 and outputs comparison signals according to the results of these comparisons.

The ADC block 154 converts the comparison signals that are received from the comparator block 152 into digital signals and outputs the digital signals to the buffer 180. The control register block 160 controls the operations of the timing generator 140, the ramp generator 170, and the buffer 180 according to the control of the DSP 200. The buffer 180 transmits the image data IDATA corresponding to the digital signals output from the ADC block 154 to the DSP 200. The DSP 200 includes an image signal processor 210, a sensor controller 220, and an interface 230.

The image signal processor 210 controls both the sensor controller 220 and the interface 230. The image sensor 110 and the DSP 200 may be implemented in chips in a single package, e.g., a multi-chip package. Alternatively, the image sensor 110 and the image signal processor 210 may be respectively implemented in chips in a single package. As another alternative, the image sensor 110 and the image signal processor 210 may be implemented together in a single chip.

The image signal processor 210 processes the image data IDATA received from the buffer 180 and transmits the processed image data to the interface 230. The sensor controller 220 generates various control signals for controlling the control register block 160 according to the control of the image signal processor 210. The interface 230 transmits the processed image data from the image signal processor 210 to the display 300.

The display 300 displays the image data output from the interface 230. The display 300 may be, for example, a thin film transistor-liquid crystal display (TFT-LCD), a light emitting diode (LED) display, an organic LED (OLED) display, or an active-matrix OLED (AMOLED) display.

Figure 2:
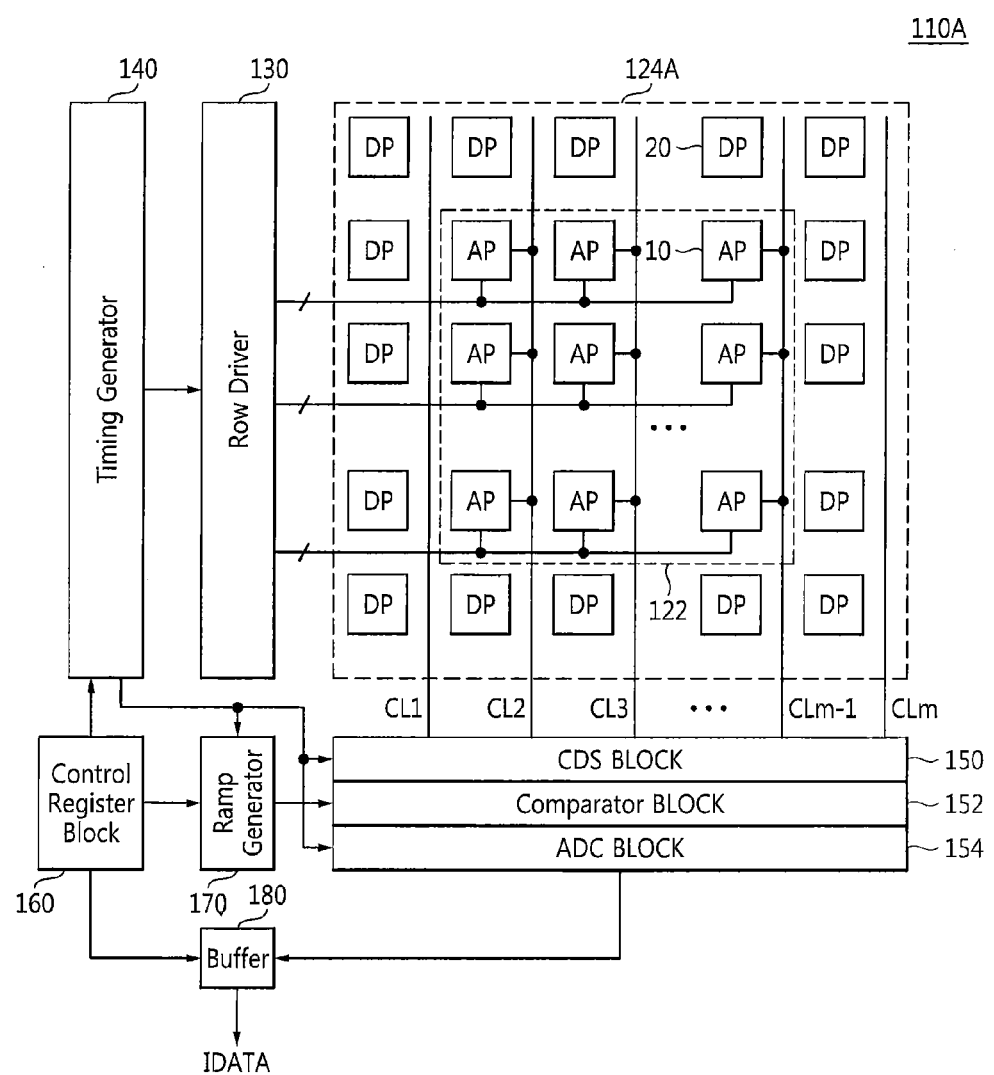
FIGS. 2 through 4 are schematic block diagrams of example embodiments of image sensors that may be used in the image processing system of FIG. 1.
Figure 3:
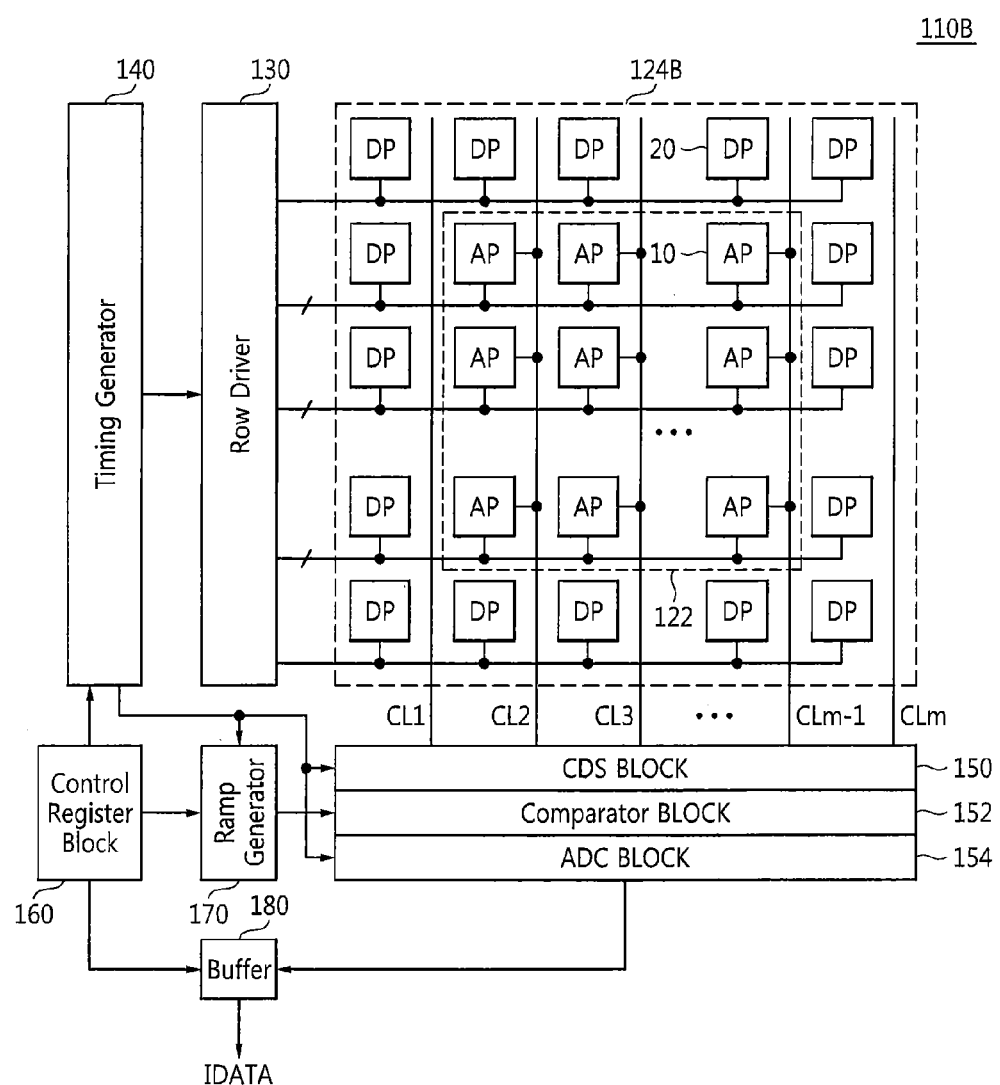
Figure 4:
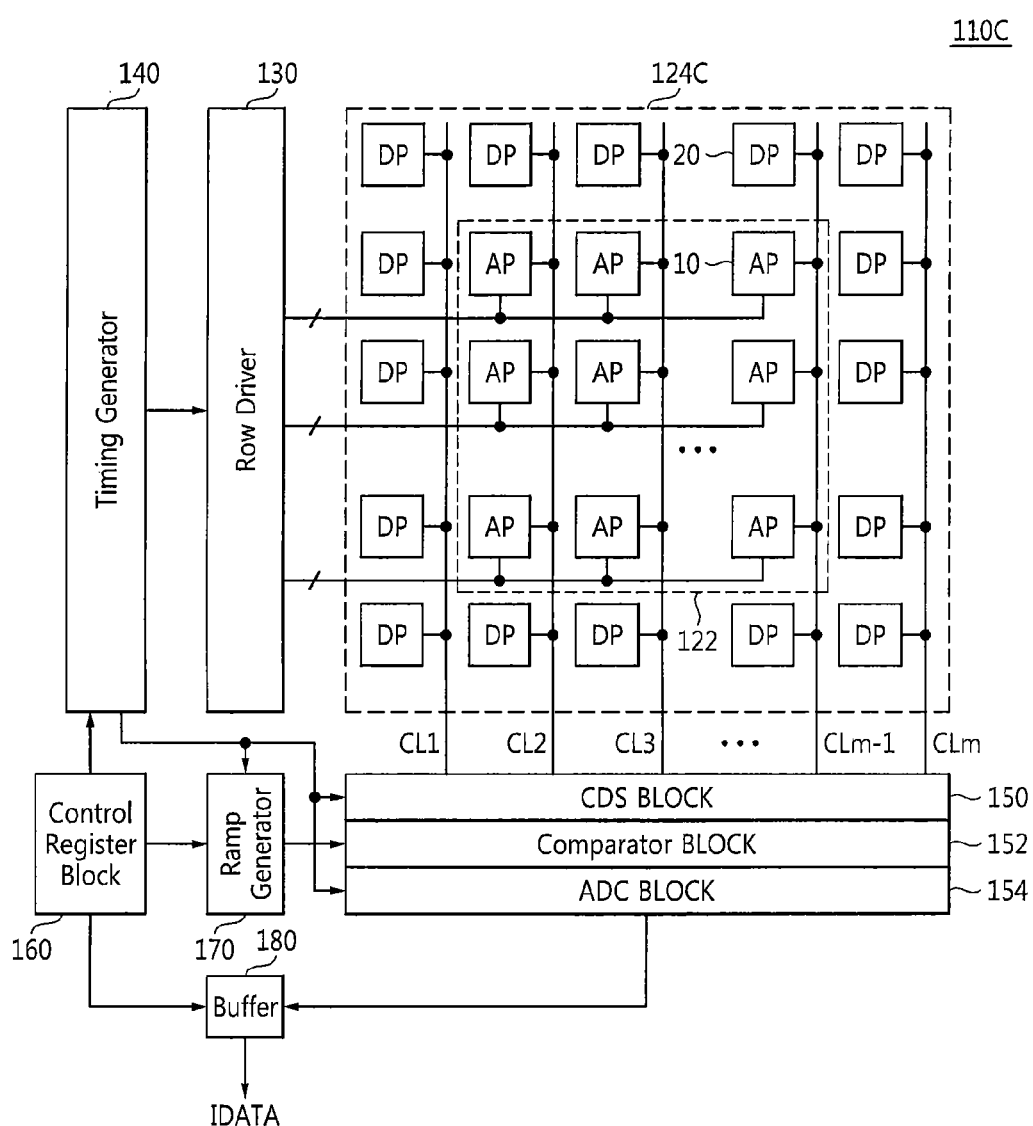

FIGS. 2 through 4 are schematic block diagrams of example embodiments 110A, 110B, and 110C of the image sensor 110 illustrated in FIG. 1. Referring to FIGS. 1 through 4, the image sensors 110A, 110B, or 110C (collectively denoted by numeral 110) may include an active pixel region 122 and a dummy region 124A, 124B, or 124C (collective denoted by numeral 124). The active pixel region 122 may include a plurality of first pixels AP or 10 and the dummy region 124 may include a plurality of second pixels DP or 20.

FIGS. 2 through 4 show embodiments that differ in terms of whether each of the second pixels 20 is connected to a corresponding one of column lines CL1 through CLm and/or whether each second pixel 20 receives a plurality of control signals. The structure and operation of the second pixels 20 will be described in detail later with reference to FIGS. 5 through 24.

Referring to FIG. 2, in image sensor 110A, each first pixel 10 is connected to a corresponding one of the column lines CL1 through CLm. The row driver 130 may transmit a plurality of control signals to the first pixels 10. Each of the first pixels 10 may output a pixel signal to one of the column lines CL1 through CLm according to these control signals.

The second pixels 20 are not connected to any of the column lines CL1 through CLm and do not receive any of the control signals from the row driver 130. Accordingly, the CDS block 150 may only receive pixel signals that are output from the first pixels 10.

Referring to FIG. 3, in image sensor 110B, the row driver 130 may transmit the control signals to the first pixels 10 and the second pixels 20 in units of rows. Each of the first pixels 10 may output a pixel signal to one of the column lines CL1 through CLm, to which each first pixel 10 is connected, according to the control signals. However, the second pixels 20 are not connected to any of the column lines CL1 through CLm. Accordingly, the CDS block 150 may only receive pixel signals that are output from the first pixels 10.

Referring to FIG. 4, in image sensor 110C, the second pixels 20 do not receive any of the control signals but may be connected to one of the column lines CL1 through CLm. Since the second pixels 20 do not receive control signals, they do not operate. Accordingly, even when each of the second pixels 20 is connected to one of the column lines CL1 through CLm, it may not output a pixel signal to the CDS block 150.

Figure 5:
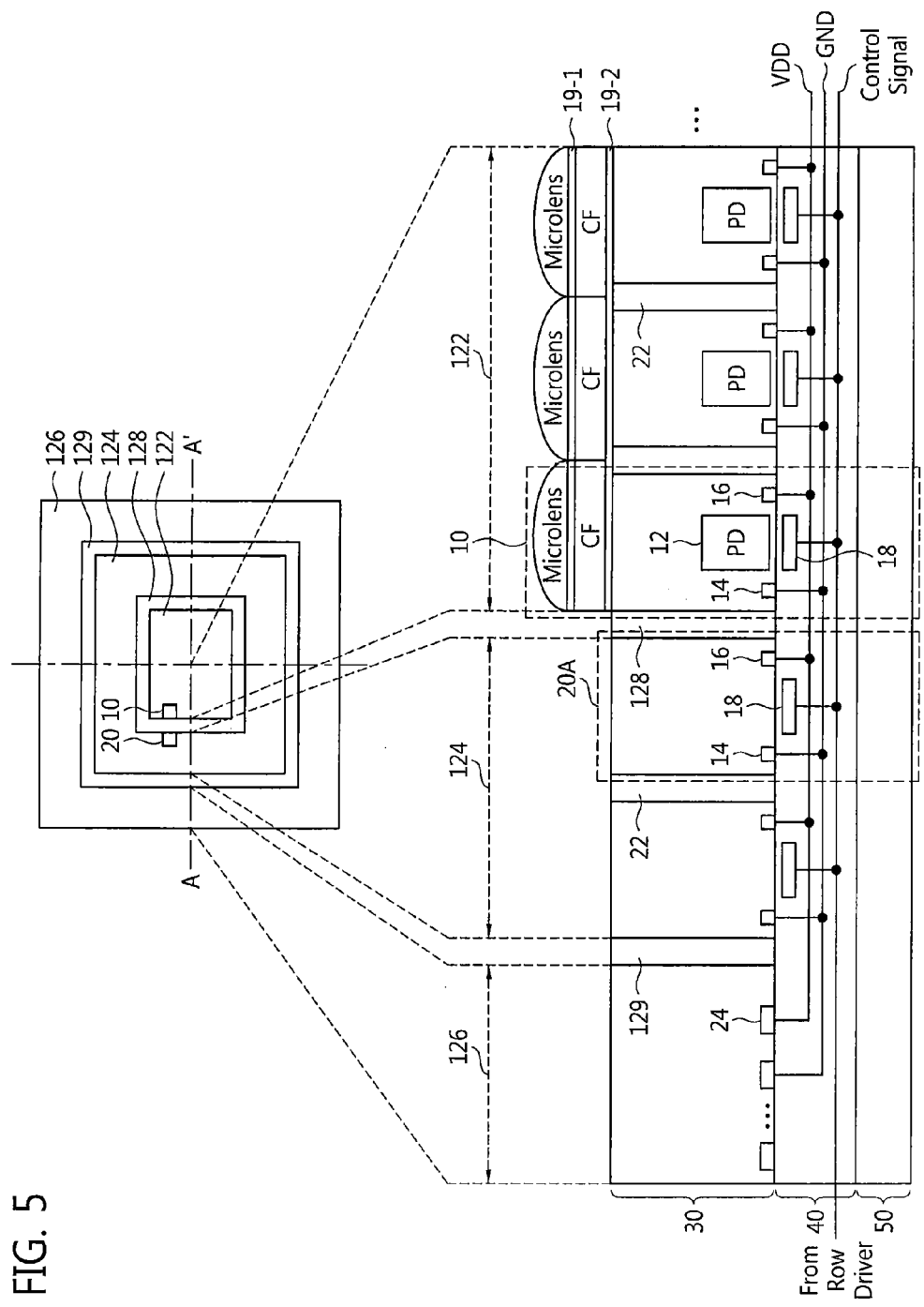
FIG. 5 is a cross-sectional view of an embodiment of the image sensor illustrated in FIG. 1 which includes an active pixel region, a dummy region, and a guard ring region.
Figure 6:
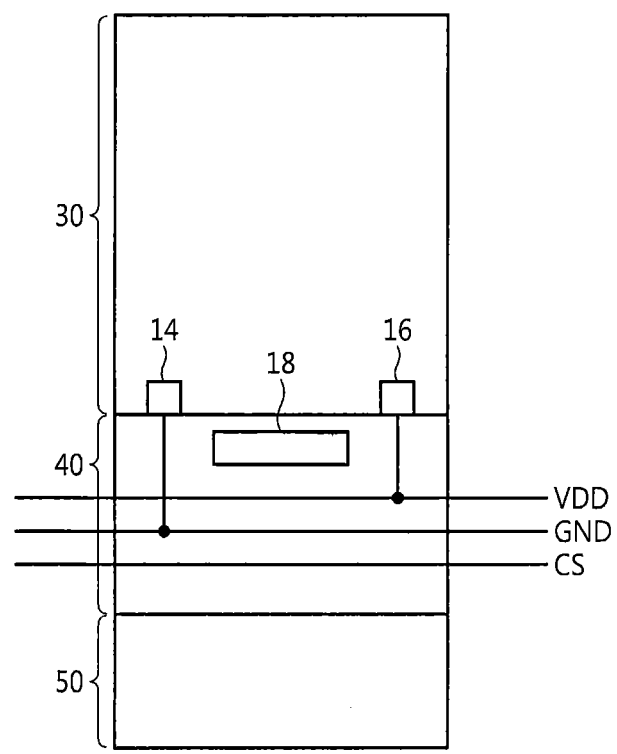
FIGS. 6 through 8 are cross-sectional views of second pixels that may be included in the dummy region illustrated in FIG. 5 according to further embodiments of the inventive concepts.
Figure 7:
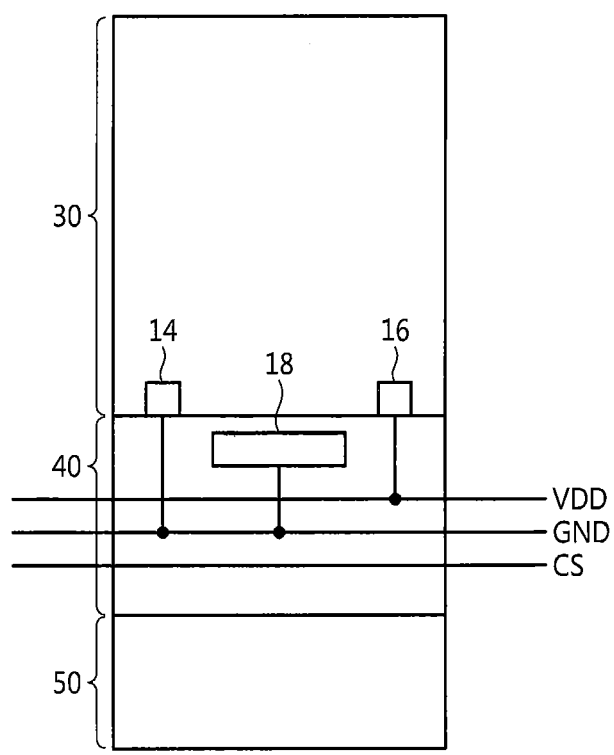
Figure 8:
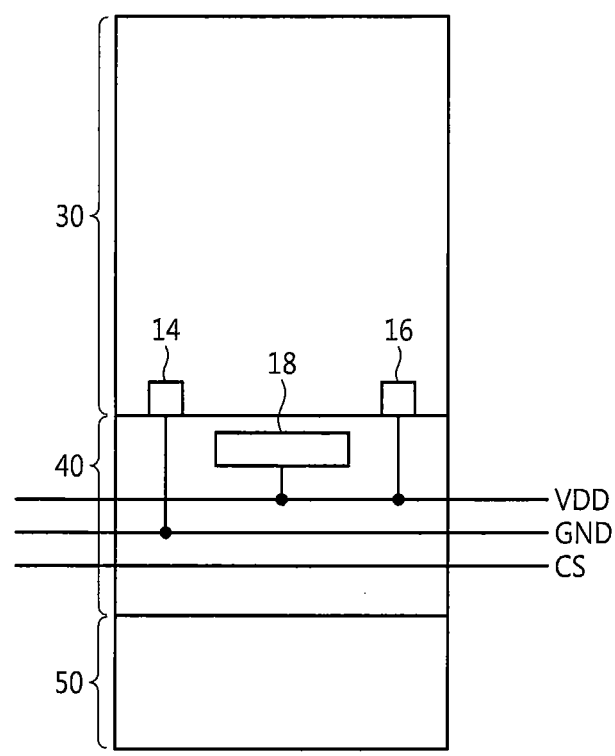

FIG. 5 is a plan view and a cross-sectional view of the image sensor 110 illustrated in FIG. 1 which includes the active pixel region 122, the dummy region 124, and a guard ring region 126. The cross-sectional view at the bottom of FIG. 5 is taken vertically along the direction A-A' of the plan view at the top of FIG. 5. FIGS. 6 through 8 are diagrams of cross-sections that illustrate alternative implementations for the second pixels 20 that are included in the dummy region 124 of FIG. 5. Since the cross-section of the second pixel 20 is symmetrical, only the left half of the cross-section is illustrated in FIG. 5 to simplify the description.

FIGS. 5 through 8 show the cross-sections of the image sensor 110 when the image sensor 110 uses backside illumination (BSI). However, the image sensor 110 may use frontside illumination (FSI) in other embodiments. Referring to FIG. 1 and FIGS. 5 through 8, the image sensor 110 may include the active pixel region 122, the dummy region 124, the guard ring region 126, a first deep trench isolation (DTI) 128, and a second DTI 129.

The active pixel region 122 may include a plurality of first pixels 10 and a DTI 22 that is formed between first pixels 10. Although an active pixel is illustrated as an example of a first pixel 10 in FIG. 5, the first pixel 10 may be an optical black pixel in other embodiments. Hereinafter, it is assumed that the first pixel 10 is an active pixel.

The dummy region 124 may include a plurality of second pixels 20. The second pixels 20 may have the designs of the second pixels 20A, 20B, 20C, or 20D that are illustrated in FIGS. 5-8, which are collectively referred to as second pixels 20). A DTI 22 may be formed between adjacent second pixels 20A, 20B, 20C, or 20D.

The first pixels 10 and the second pixels 20A, 20B, 20C, or 20D may include an epitaxial layer 30 and a wiring layer 40. The epitaxial layer 30 may be an epitaxially grown silicon layer. In the active pixel region 122, the epitaxial layer 30 may include a photoelectric conversion element PD or 12, a ground voltage terminal 14, and a power supply voltage terminal 16. The second pixels 20A, 20B, 20C, or 20D may include a ground voltage terminal 14 and a power supply voltage terminal 16, but do not include a photoelectric conversion element corresponding to the photoelectric conversion element 12. However, the second pixels 20A, 20B, 20C, or 20D may include the photoelectric conversion element PD or 12 in other embodiments.

The photoelectric conversion element 12 may accumulate charges that are generated according to the intensity of light incident thereon through a microlens. The photoelectric conversion element 12 may be implemented as a photodiode, a photo transistor, a photogate, or a pinned photodiode.

The ground voltage terminal 14 may be electrically connected to a first guard ring 24 that is provided in the guard ring region 126 that receives a ground voltage GND. The ground voltage GND may be 0 V. The power supply voltage terminal 16 may be electrically connected to a second guard ring 24 that receives a power supply voltage VDD. For example, the power supply voltage VDD may be in a range from 2 to 5 V.

The epitaxial layer 30 may also include a source terminal (not shown) and a drain terminal (not shown) of each transistor and a floating diffusion node (not shown). The wiring layer 40 may include a gate terminal 18 of each transistor and a plurality of conductive lines. Although only one gate terminal 18 and only one control signal CS are illustrated in FIGS. 5 through 8, more than one gate terminal 18 and more than one control signal CS may be provided in other embodiments.

The gate terminal 18 may receive the control signal CS from the row driver 130 or may be connected to the floating diffusion node. A gate insulation layer (not shown) may be formed between the gate terminal 18 and the epitaxial layer 30. The gate insulation layer may be formed of SiO2, SiON, SiN, Al2O3, Si3N4, GexOyNz, GexSiyOz, or a high dielectric constant material, which may be formed via atomic layer deposition using HfO2, ZrO2, Al2O3, Ta2O5, hafnium silicate, zirconium silicate, or a combination thereof.

The plurality of conductive lines may transmit the ground voltage GND, the power supply voltage VDD, and the control signal CS to the first pixels 10 and/or the second pixels 20A, 20B, 20C, or 20D.

Referring to FIG. 5, a conductive line that is electrically connected to the power supply voltage terminal 16 may be electrically connected to a guard ring that receives the power supply voltage VDD among the plurality of the guard rings 24 in the guard ring region 126. A conductive line that is electrically connected to the ground voltage terminal 14 may be electrically connected to a guard ring that receives the ground voltage GND among the plurality of the guard rings 24 in the guard ring region 126. A conductive line that is electrically connected to the gate terminal 18 and transmits the control signal CS may be connected to the row driver 130.

Referring to FIG. 6, the gate terminal 18 of the second pixel 20B is not be connected to the conductive line that transmits the control signal CS. Referring to FIG. 7, the gate terminal 18 of the second pixel 20C is connected to the conductive line that is connected to the guard ring that transmits the ground voltage GND. Referring to FIG. 8, the gate terminal 18 of the second pixel 20D is connected to the conductive line that is connected to the guard ring that transmits the power supply voltage VDD. Accordingly, the second pixels 20B, 20C, and 20D respectively illustrated in FIGS. 6 through 8 do not operate and may thus not output a pixel signal.

The first pixels 10 and the second pixels 20A, 20B, 20C, or 20D may also include a carrier substrate 50.

The first pixel 10 illustrated in FIG. 5 may also include a microlens, a first planarization layer 19-1, a color filter CF, and a second planarization layer 19-2. The second pixel 20A illustrated in FIG. 5 may not include the microlens, the first planarization layer 19-1, the color filter CF, or the second planarization layer 19-2.

The microlens may be formed on the top (i.e., a place at which incident light arrives first) of the first pixel 10. The microlens may be used to increase light gathering power, thereby increasing the quality of captured images.

The color filter CF may be formed below the microlens to selectively pass light with a predetermined wavelength (e.g., red, green, blue, magenta, yellow, or cyan). The first and second planarization layers 19-1 and 19-2 may be formed on the top and bottom, respectively, of the color filter CF to prevent the reflection of light incident through the microlens and the color filter CF. In other words, the first and second planarization layers 19-1 and 19-2 efficiently transmit the incident light, thereby increasing the performance (e.g., light absorptance and photosensitivity) of the image sensor 110.

The second pixel 20 may also include one or more of the microlens, the first planarization layer 19-1, the color filter CF, and the second planarization layer 19-2 or may include a light-absorbing film (not shown) in other embodiments. The light-absorbing film may include metallic substance.

The DTI 22 may be formed between first pixels 10 and between second pixels 20A, 20B, 20C, or 20D to electrically isolate the first pixels 10 from each other or the second pixels 20A, 20B, 20C, or 20D from each other, thereby reducing or preventing electrical and/or optical crosstalk between the adjacent pixels 10, 20A, 20B, 20C, or 20D. Electrical crosstalk is an effect which decreases a signal-to-noise ratio (SNR) due to the coupling of signal energy of electrical signals between the adjacent pixels 10, 20A, 20B, 20C, or 20D. Optical crosstalk is an effect which decreases the SNR because light incident on the epitaxial layer 30 is transmitted to other adjacent areas.

The height of the DTI 22 may vary within the epitaxial layer 30. The first DTI 128 is formed between the active pixel region 122 and the dummy region 124 and the second DTI 129 is formed between the dummy region 124 and the guard ring region 126.

The first DTI 128 and the second DTI 129 are substantially the same as the DTI 22 and are separately defined only to distinguish the regions 122, 124, and 126. The image sensor 110 may not include the second DTI 129 in some embodiments.

The guard ring region 126 may be formed adjacent the dummy region 124 and may surround the active pixel region 122 and the dummy region 124. The guard ring region 126 may reduce the mutual influence between the active pixel region 122 and the outside.

The guard ring region 126 may include at least one guard ring 24 that receives the ground voltage GND or the power supply voltage VDD from the outside. As described above, the guard ring 24 that receives the ground voltage GND may be connected to the ground voltage terminal 14 of the first pixel 10 and/or the second pixel 20A, 20B, 20C, or 20D and the guard ring 24 that receives the power supply voltage VDD may be connected to power supply voltage terminal 16 of the first pixel 10.

FIGS. 9 through 12 are circuit diagrams of second pixels that have a 4-transistor structure according to different embodiments of the inventive concepts. Referring to FIGS. 9 through 12, second pixels 20-1A, 20-1B, 20-1C, and 20-1D having the 4-transistor structure may include a transfer transistor TX, a floating diffusion node (or a floating diffusion region) FD, a reset transistor RX, a drive transistor DX, and a select transistor SX.

The transfer transistor TX may operate in response to a transfer control signal TG. The reset transistor RX may operate in response to a reset control signal RS. The select transistor SX may operate in response to a selection control signal SEL.

Figure 9:
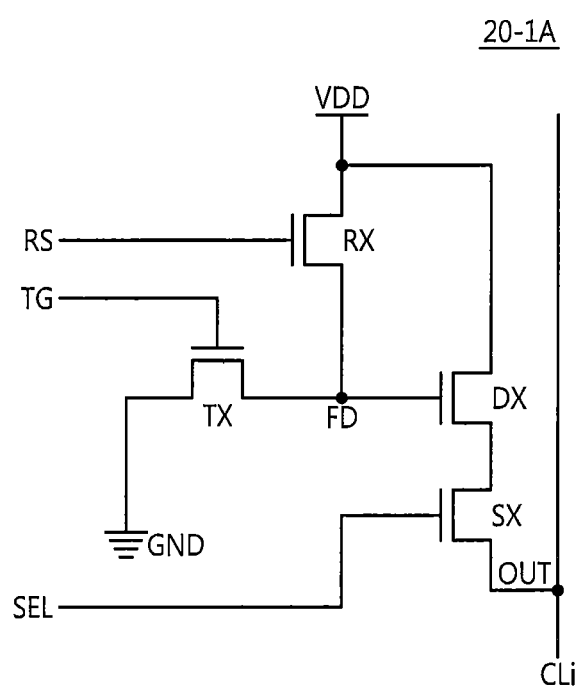
FIGS. 9 through 12 are circuit diagrams of second pixels that have a 4-transistor structure according to various embodiments of the inventive concepts.

Referring to FIG. 9, the second pixel 20-1A may include the transistors TX, RX, and SX receiving the control signals TG, RS, and SEL, respectively, but may not include a photoelectric conversion element. Since the second pixel 20-1A does not include a photoelectric conversion element, the second pixel 20-1A does not output a pixel signal that is generated from light to a corresponding column line CLi, but may output a pixel signal OUT having a weak noise component to a corresponding column line CLi.

The select transistor SX is connected to the corresponding column line CLi so that the pixel signal OUT of the second pixel 20-1A is output to the corresponding column line CLi in the embodiment illustrated in FIG. 9. However, the select transistor SX may not be connected to the corresponding column line CLi so that no pixel signal is output in other embodiments.

Figure 10:
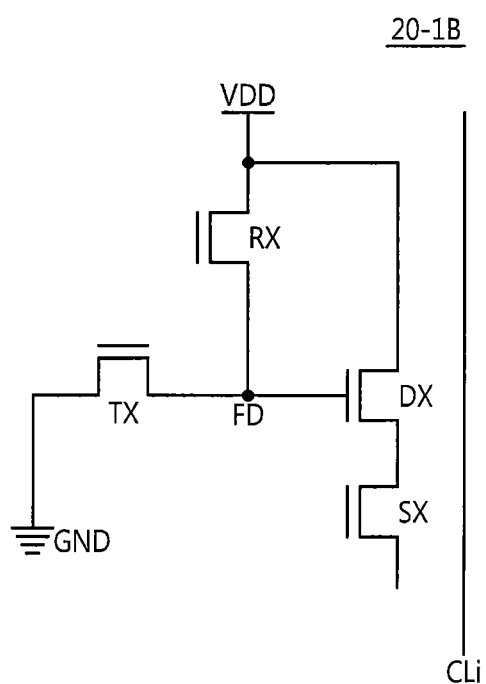
Figure 11:
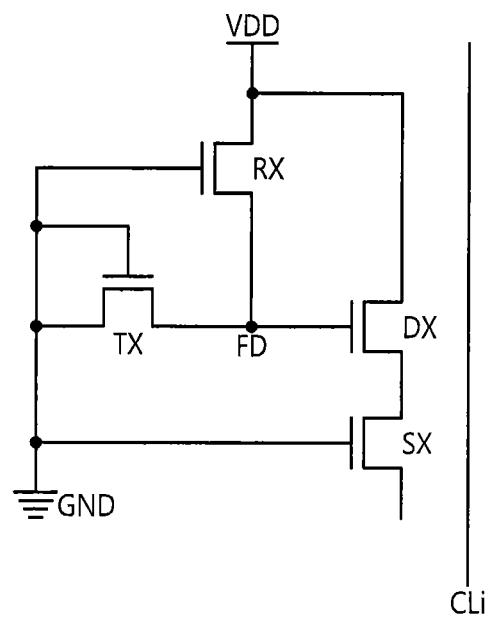
Figure 12:
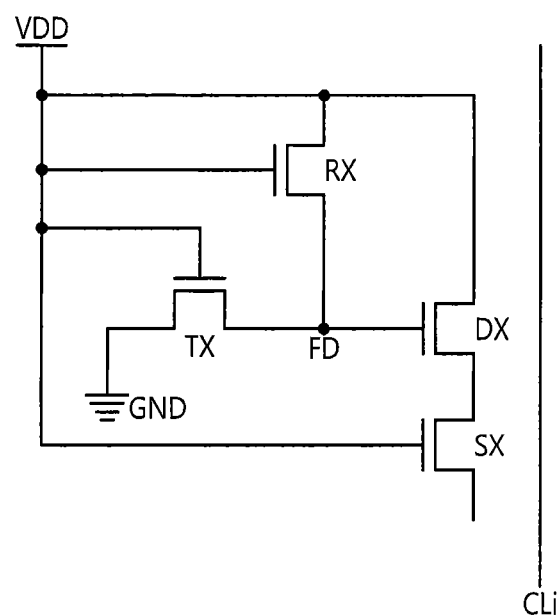

Referring to FIG. 10, the gate of each of the transistors TX, RX, and SX of the second pixel 20-1B is floated. The select transistor SX is not connected to the corresponding column line CLi. Referring to FIG. 11, the gate of each of the transistors TX, RX, and SX of the second pixel 20-1C is connected to a conductive line that transmits the ground voltage GND. The select transistor SX is not connected to the corresponding column line CLi. Referring to FIG. 12, the gate of each of the transistors TX, RX, and SX of the second pixel 20-1D is connected to a conductive line that transmits the power supply voltage VDD. The select transistor SX is not connected to the corresponding column line CLi.

FIGS. 13 through 16 are circuit diagrams of second pixels that have a 3-transistor structure according to different embodiments of the inventive concepts. Referring to FIGS. 13 through 16, second pixels 20-2A, 20-2B, 20-2C, and 20-2D having the 3-transistor structure include the reset transistor RX, the drive transistor DX, and the select transistor SX but do not include a photoelectric conversion element.

Figure 13:
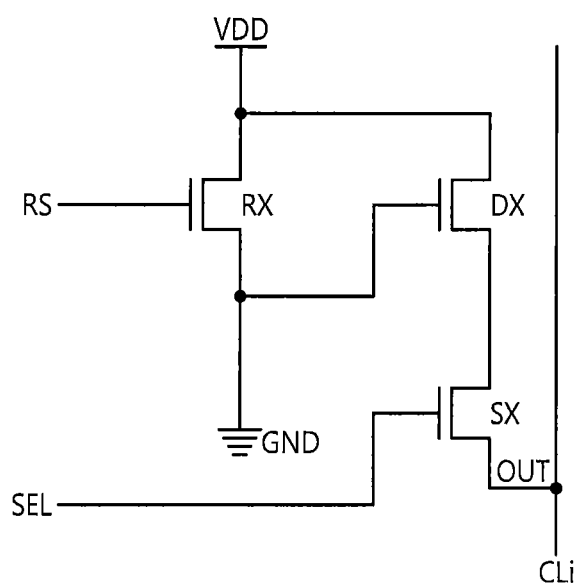
FIGS. 13 through 16 are circuit diagrams of second pixels that have a 3-transistor structure according to various embodiments of the inventive concepts.
Figure 14:
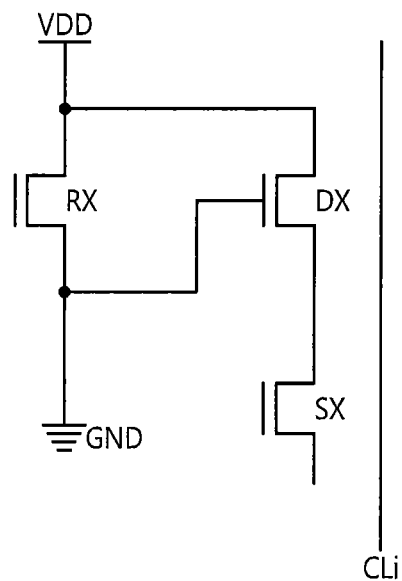
Figure 15:
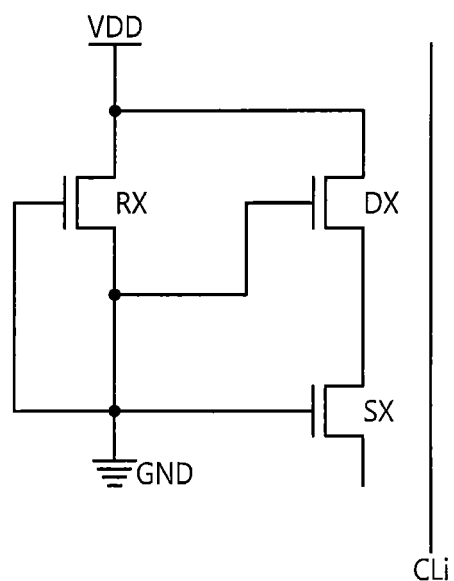
Figure 16:
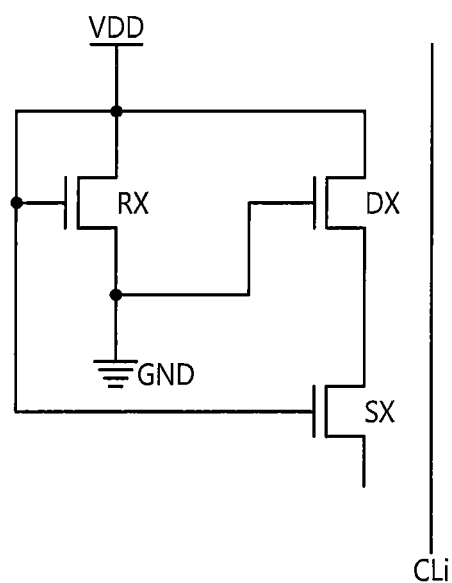

Referring to FIG. 13, the second pixel 20-2A includes the transistors RX and SX that receive the respective control signals RS and SEL, but does not include a photoelectric conversion element. The select transistor SX is connected to the corresponding column line CLi. Referring to FIG. 14, the gate of each of the transistors RX and SX of the second pixel 20-2B is floated. The select transistor SX is not connected to the corresponding column line CLi. Referring to FIG. 15, the gate of each of the transistors RX, DX, and SX of the second pixel 20-2C is connected to a conductive line that transmits the ground voltage GND. The select transistor SX is not connected to the corresponding column line CLi. Referring to FIG. 16, the gate of each of the transistors RX and SX of the second pixel 20-2D is connected to a conductive line that transmits the power supply voltage VDD. The select transistor SX is not connected to the corresponding column line CLi.

FIGS. 17 through 20 are circuit diagrams of second pixel that have a 5-transistor structure according to different embodiments of the inventive concepts. Referring to FIGS. 17 through 20, second pixels 20-3A, 20-3B, 20-3C, and 20-3D having the 5-transistor structure may include the transfer transistor TX, the reset transistor RX, the drive transistor DX, the select transistor SX, and another transistor GX. However, the second pixels 20-3A, 20-3B, 20-3C, and 20-3D do not include a photoelectric conversion element. The transistor GX may transmit the transfer control signal TG to the gate of the transfer transistor TX in response to the selection control signal SEL.

Figure 17:
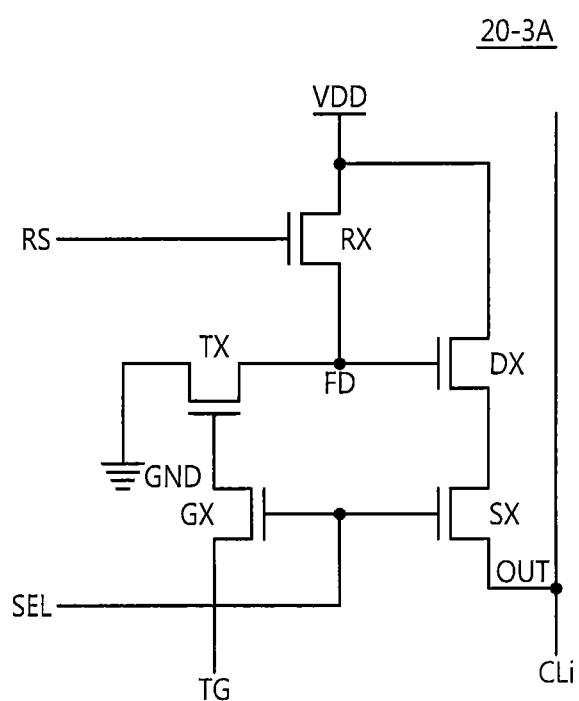
FIGS. 17 through 20 are circuit diagrams of second pixels that have a 5-transistor structure according to various embodiments of the inventive concepts.

Referring to FIG. 17, the second pixel 20-3A includes the transistors TX, RX, GX, and SX that receive the respective control signals TG, RS, and SEL, but does not include a photoelectric conversion element. The select transistor SX is connected to the corresponding column line CLi. Accordingly, the pixel signal OUT of the second pixel 20-3A may be transmitted to the corresponding column line CLi.

Figure 18:
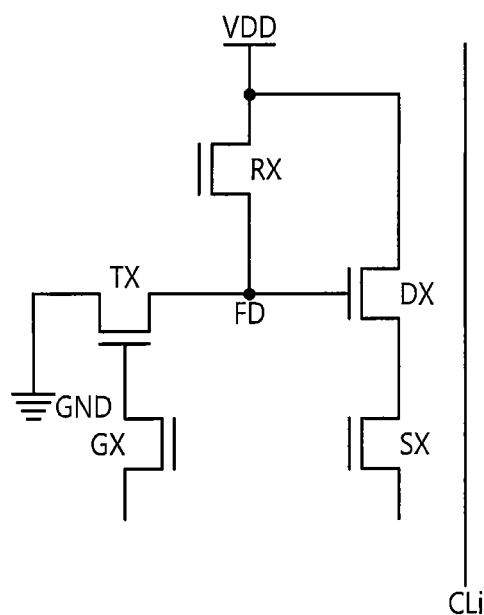
Figure 19:
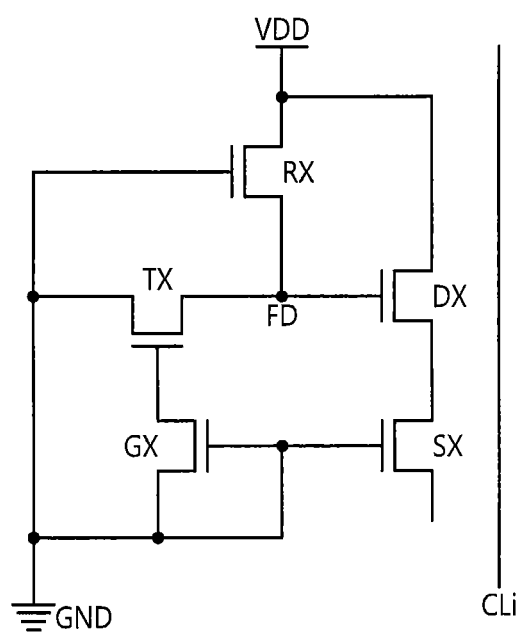
Figure 20:
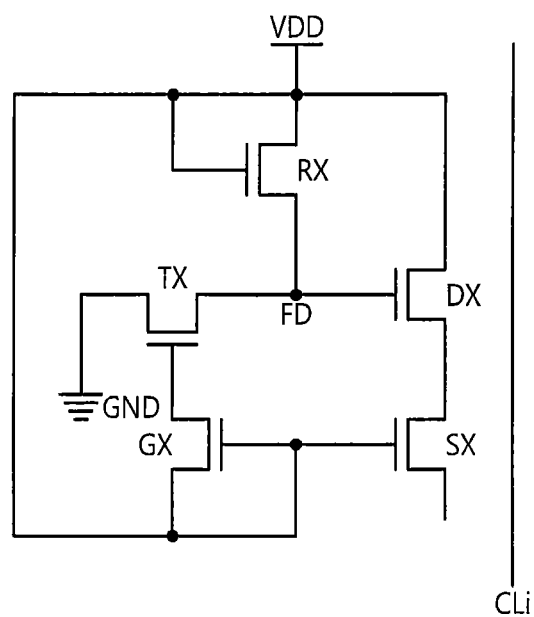

Referring to FIG. 18, the gate of each of the transistors GX, RX, and SX of the second pixel 20-3B is floated. The select transistor SX is not connected to the corresponding column line CLi. Referring to FIG. 19, the gate of each of the transistors GX, RX, and SX of the second pixel 20-3C is connected to a conductive line that transmits the ground voltage GND. The select transistor SX is not connected to the corresponding column line CLi. Referring to FIG. 20, the gate of each of the transistors GX, RX, and SX of the second pixel 20-3D is connected to a conductive line that transmits the power supply voltage VDD. The select transistor SX is not connected to the corresponding column line CLi.

FIGS. 21 through 24 are circuit diagrams of second pixels that have a photogate structure according to different embodiments of the inventive concepts. Referring to FIGS. 21 through 24, second pixels 20-4A, 20-4B, 20-4C, and 20-4D having the photogate structure include the transfer transistor TX, the reset transistor RX, the drive transistor DX, the select transistor SX, and a photogate PX. The photogate PX operates in response to a control signal PG.

Figure 21:
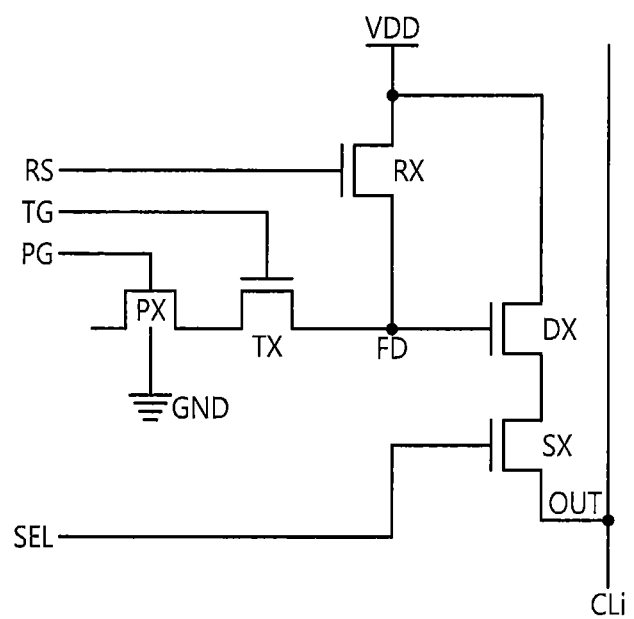
FIGS. 21 through 24 are circuit diagrams of second pixel that have a photogate structure according to various embodiments of the inventive concepts.
Figure 22:
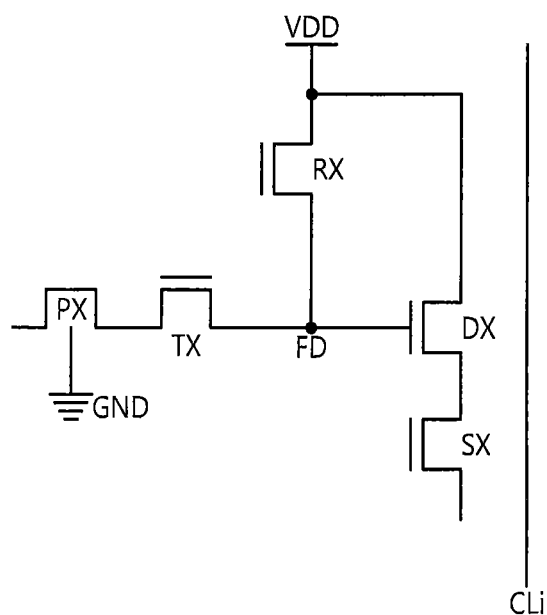

Referring to FIG. 21, the second pixel 20-4A includes the transistors TX, RX, PX, and SX that receive the respective control signals TG, RS, PG, and SEL. The select transistor SX is connected to the corresponding column line CLi. Accordingly, the pixel signal OUT of the second pixel 20-4A may be transmitted to the corresponding column line CLi. Referring to FIG. 22, the gate of each of the transistors PX, TX, RX, and SX of the second pixel 20-4B is floated. The select transistor SX is not connected to the corresponding column line CLi.

Figure 23:
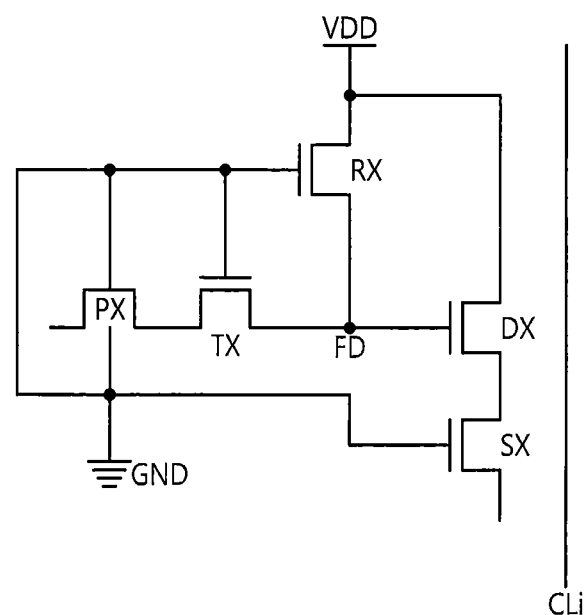
Figure 24:
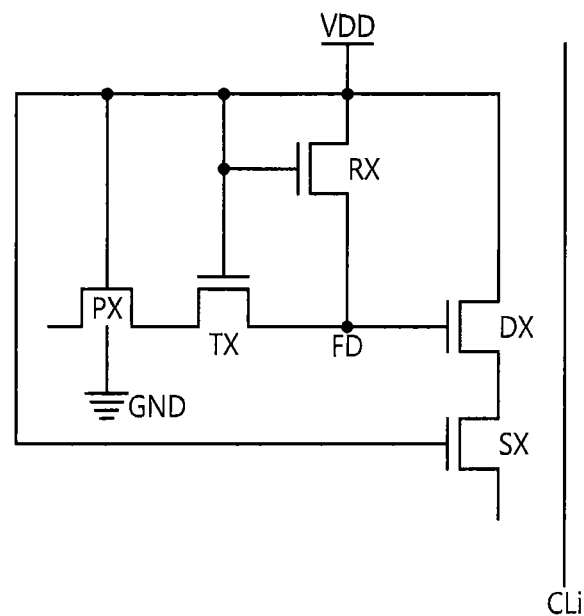

Referring to FIG. 23, the gate of each of the transistors PX, TX, RX, and SX of the second pixel 20-4C is connected to a conductive line that transmits the ground voltage GND. The select transistor SX is not connected to the corresponding column line CLi. Referring to FIG. 24, the gate of each of the transistors PX, TX, RX, and SX of the second pixel 20-4D is connected to a conductive line that transmits the power supply voltage VDD. The select transistor SX is not connected to the corresponding column line CLi.

Figure 25:
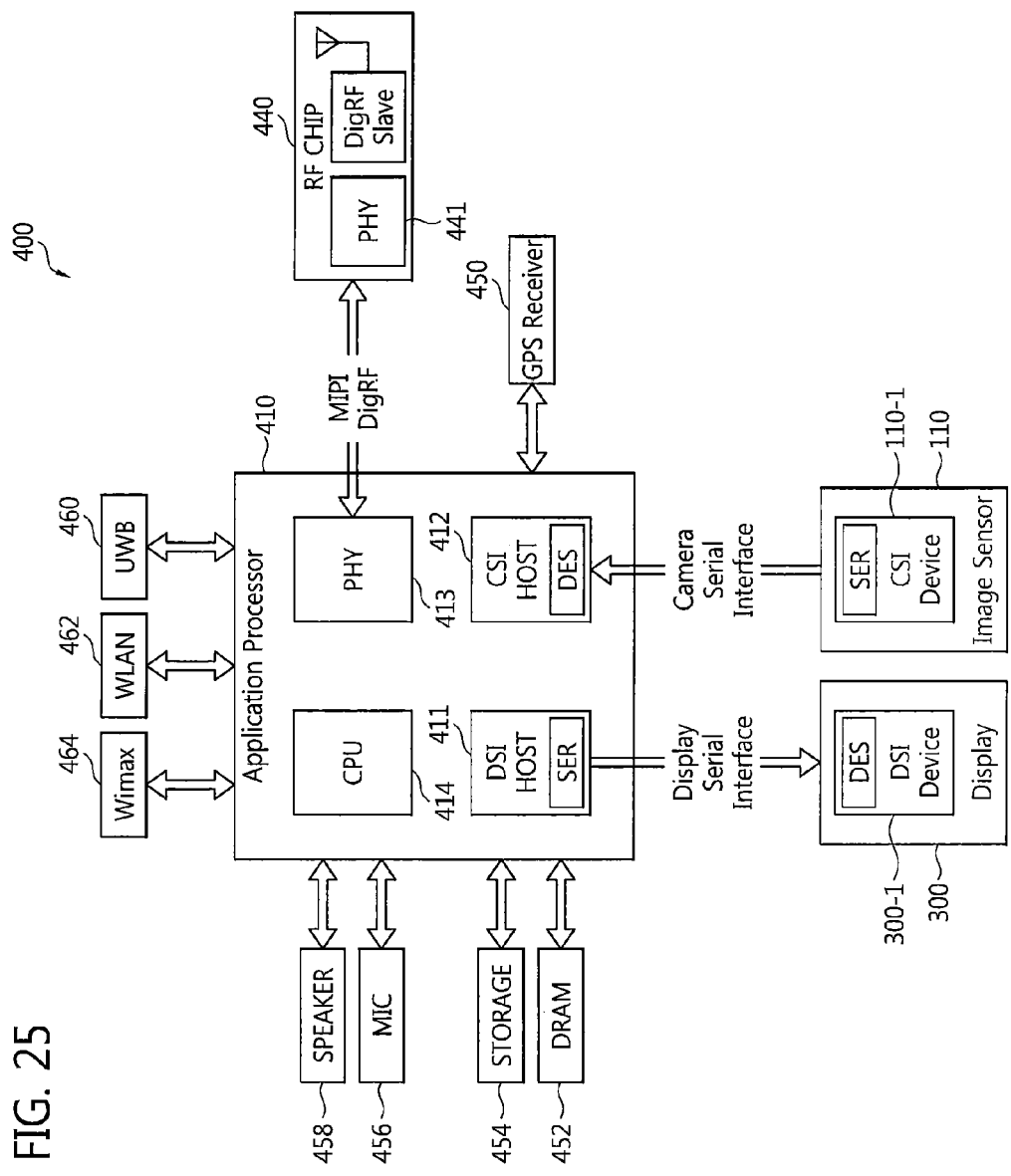
FIG. 25 is a block diagram of an electronic system including the image sensor illustrated in FIG. 1 according to some embodiments of the inventive concepts.

FIG. 25 is a block diagram of an electronic system 400 that includes the image sensor 110 that is illustrated in FIG. 1. Referring to FIGS. 1 through 25, the electronic system 400 may be implemented as an image processing system that can use or support a mobile industry processor interface (MIPI). The image processing system may be a laptop computer, a cellular phone, a smart phone, a tablet PC, a PDA, an EDA, a digital still camera, a digital video camera, a PMP, a MID, a wearable computer, an IoT device, or an IoE device. The electronic system 400 includes an application processor 410, the image sensor 110, and the display 300.

A camera serial interface (CSI) host 412 in the application processor 410 may perform serial communication with a CSI device 110-1 in the image sensor 110 through a CSI. A deserializer DES and a serializer SER may be included in the CSI host 412 and the CSI device 110-1, respectively. As described above with reference to FIGS. 1 through 24, the image sensor 110 includes a first pixel 10 formed in the active pixel region 122, a second pixel 20 formed in the dummy region 124 adjacent the active pixel region 122, and the first DTI 128 formed between the first pixel 10 and the second pixel 20.

A display serial interface (DSI) host 411 in the application processor 410 may perform serial communication with a DSI device 300-1 in the display 300 through DSI. A serializer SER and a deserializer DES may be included in the DSI host 411 and the DSI device 300-1, respectively. The image data IDATA output from the image sensor 110 may be transmitted to the application processor 410 through CSI. The application processor 410 may process the image data IDATA and may transmit processed image data to the display 300 through DSI.

The electronic system 400 may also include a radio frequency (RF) chip 440 that communicates with the application processor 410. A physical layer (PHY) 413 in the application processor 410 and a PHY 441 in the RF chip 440 may communicate data with each other according to MIPI DigRF.

A central processing unit (CPU) 414 in the application processor 410 may control the operations of the DSI host 411, the CSI host 412, and the PHY 413. The CPU 414 may include at least one core. The application processor 410 may be implemented in an integrated circuit (IC) or a system on chip (SoC). The application processor 410 may be a processor or a host that can control the operations of the image sensor 110.

The electronic system 400 may further include a global positioning system (GPS) receiver 450, a volatile memory 452 such as dynamic random access memory (DRAM), a data storage 454 formed using non-volatile memory such as flash-based memory, a microphone (MIC) 456, and/or a speaker 458. The data storage 454 may be implemented as an external memory detachable from the application processor 410. The data storage 454 may also be implemented as a universal flash storage (UFS), a multimedia card (MMC), an embedded MMC (eMMC), or a memory card. The electronic system 400 may communicate with external devices using at least one communication protocol or standard, e.g., ultra-wideband (UWB) 460, wireless local area network (WLAN) 462, worldwide interoperability for microwave access (Wimax) 464, or long term evolution (LTETM) (not shown). In other embodiments, the electronic system 400 may also include a near field communication (NFC) module, a WiFi module, or a Bluetooth module.

Figure 26:
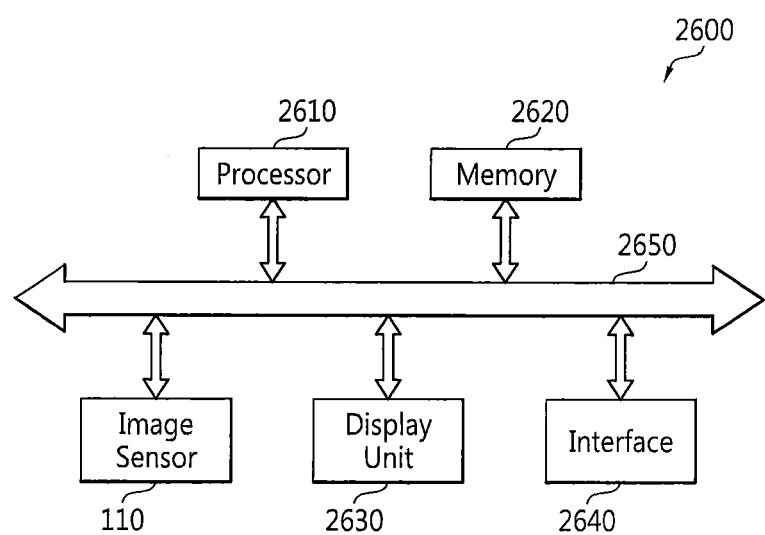
FIG. 26 is a block diagram of an electronic system including the image sensor illustrated in FIG. 1 according to further embodiments of the inventive concepts.

FIG. 26 is a block diagram of an electronic system 2600 that includes the image sensor 110 illustrated in FIG. 1. Referring to FIGS. 1 through 26, the electronic system 2600 may include the image sensor 110, a processor 2610, a memory 2620, a display unit 2630, and an interface 2640.

The processor 2610 may control the operation of the image sensor 110. The processor 2610 may process pixel signals output from the image sensor 110 and generate image data. The memory 2620 may store a program for controlling the operation of the image sensor 110 and may store image data generated by the processor 2610. The processor 2610 may execute the program stored in the memory 2620. The memory 2620 may be formed as volatile or non-volatile memory.

The display unit 2630 may display the image data output from the processor 2610 or the memory 2620. The interface 2640 may input and output the image data. The interface 2640 may be a wireless interface.

Figure 27:
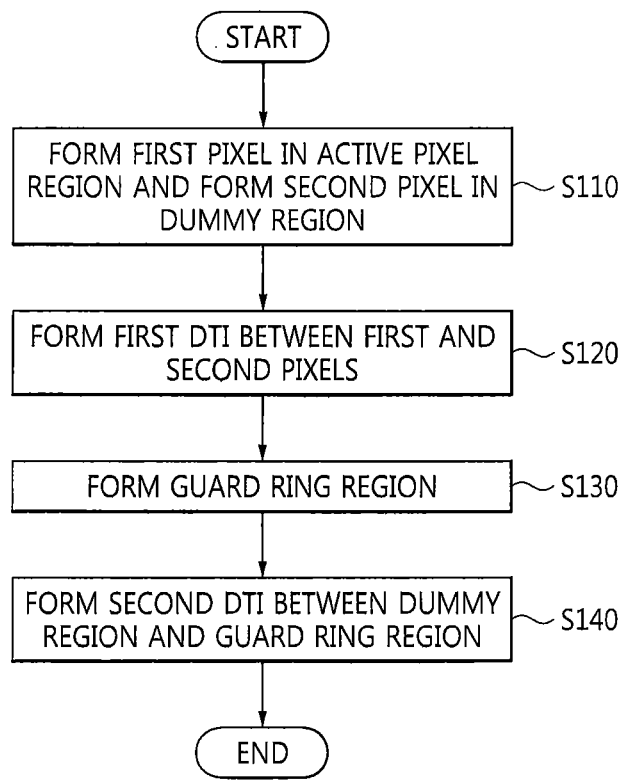
FIG. 27 is a flowchart showing the process of manufacturing an image sensor according to some embodiments of the inventive concepts.

FIG. 27 is a flowchart showing a process of forming an image sensor according to some embodiments of the inventive concepts. In particular, FIG. 27 illustrates operations for forming the regions 122, 124, and 126, the pixels 10 and 20, and the DTIs 128 and 129. It will be appreciated that the methods may be performed in a different order from the order illustrated in FIG. 27.

Referring to FIGS. 1 through 27, the first pixel 10 and the second pixel 20 may be formed in the active pixel region 122 and the dummy region 124, respectively, in operation 5110. The first DTI 128 may be formed between the first pixel 10 and the second pixel 20 in operation S120. The guard ring region 126 may be formed adjacent the dummy region 124 in operation S130. The second DTI 129 may be formed between the dummy region 124 and the guard ring region 126 in operation S140.

As described above, according to some embodiments of the inventive concepts, an image sensor has a dummy region that is formed between an active pixel region and a guard ring region. The dummy region may include dummy pixels that have the same transistors and DTI structure as the active pixels that are formed in the active pixel region, thereby increasing the uniformity of transistors of the active pixel and the uniformity of DTIs formed among the active pixels. As a result, the performance of the image sensor may be improved.

While the inventive concepts have been particularly shown and described with reference to exemplary embodiments thereof, it will be understood by those of ordinary skill in the art that various changes in forms and details may be made therein without departing from the spirit and scope of the inventive concepts as defined by the following claims.

What is claimed is:

1. An image sensor comprising:
   a first pixel in an active pixel region;
   a second pixel in a dummy region that is adjacent the active pixel region;
   a first deep trench isolation (DTI) that is between the first pixel and the second pixel;
   a guard ring in a guard ring region adjacent the dummy region, the guard ring electrically connected to a first voltage source; and
   a second DTI that is between the dummy region and the, guard ring region,
   wherein the first pixel includes a photoelectric conversion element and the second pixel does not include a photoelectric conversion element.

2. The, image sensor of claim 1, wherein the second pixel comprises a plurality of transistors, wherein a gate terminal of each of the transistors is electrically connected to the guard ring, and wherein the first voltage source supplies a ground voltage.

3. The image sensor of claim 1, wherein the second pixel comprises a plurality of transistors, wherein a gate terminal of each of the transistors is electrically connected to the guard ring, and the wherein first voltage source supplies a constant voltage.

4. An image sensor comprising:
   a first pixel in a active pixel region;
   a second pixel in a dummy region that is adjacent the active pixel region;
   a first deep trench isolation (DTI) that is between the first pixel and the second pixel;
   a guard in a guard ring region adjacent the dummy region the guard ring electrically connected to a first voltage source; and
   a plurality of column lines that are connected to a correlated double sampling unit;
   wherein the first pixel is connected to the correlated double sampling unit via a first of the column lines and the second pixel is not connected to the correlated double sampling unit.

5. The image sensor of claim 4, wherein the second pixel comprises a plurality of transistors, and wherein a gate terminal of each of the transistors is floated.

6. The image sensor of claim 4, further comprising:
   a second DTI that is between the dummy region and the guard ring region.

7. The image sensor of claim 6, wherein the second pixel comprises a plurality of transistors, wherein a gate terminal of each of the transistors is electrically connected to the guard ring, and wherein the first voltage source supplies a ground voltage.

8. The image sensor of claim 6, wherein the second pixel comprises a plurality of transistors, wherein a gate terminal of each of the transistors is electrically connected to the guard ring, and wherein the first voltage source supplies a constant voltage.

9. An image processing system comprising:
- an image sensor that is configured to generate image data; and
- a processor that is configured to process the image data, wherein the image sensor comprises:
    - a first pixel in an active pixel region;
    - a second pixel in a dummy region that is adjacent the active pixel region;
    - a first deep trench isolation (DTI) that is between the first pixel and the second pixel;
    - a guard ring in a guard ring region that is adjacent the dummy region, the guard ring electrically connected to a first voltage source; and
    - a second DTI that is between the dummy region and the guard ring region.

10. The image processing system of claim 9, wherein the first pixel comprises a photoelectric conversion element and the second pixel does not comprise a photoelectric conversion element.

11. The image processing system of claim 10, wherein the second pixel does not comprise a color filter.

12. An image sensor, comprising:
- an active pixel region having a first pixel that is configured to output a first pixel signal using accumulated charges that are generated from light incident on the first pixel;
- a guard ring region that includes a first guard ring that is connected to a first voltage source and a second guard ring that is connected to a second voltage source;
- a dummy region having a second pixel, the dummy region between the active pixel region and the guard ring region; and
- a first deep trench isolation (DTI) between the active pixel region and the dummy region.

13. The image sensor of claim 12, wherein any pixel signal output by the second pixel is not based on an amount of light incident on the second pixel.

14. The image sensor of claim 12, further comprising a plurality of column lines that extend through the active pixel region and the dummy region, wherein only pixels in the active pixel region are electrically connected to any of the column lines.

15. The image sensor of claim 12, wherein the first pixel includes a photoelectric conversion element and the second pixel does not include a photoelectric conversion element.

16. The image sensor of claim 12, wherein the second pixel includes a plurality of transistors, and wherein gate terminals of each of the transistors included in the second pixel are electrically connected to the first guard ring.

17. The image sensor of claim 12, further comprising a second DTI between the dummy region and the guard ring region.

* * * * *